United States Patent
Sforzin

(10) Patent No.: US 9,755,617 B2
(45) Date of Patent: Sep. 5, 2017

(54) METHODS AND APPARATUSES FOR DRIVING A NODE TO A PUMPED VOLTAGE

(71) Applicant: Micron Technology, Inc., Boise, ID (US)

(72) Inventor: Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 13/952,373

(22) Filed: Jul. 26, 2013

(65) Prior Publication Data

US 2015/0028921 A1    Jan. 29, 2015

(51) Int. Cl.
| | | |
|---|---|---|
| *H03B 1/00* | (2006.01) | |
| *H03K 3/00* | (2006.01) | |
| *H03K 3/012* | (2006.01) | |
| *H03K 19/00* | (2006.01) | |
| *H03K 19/0185* | (2006.01) | |

(52) U.S. Cl.
CPC ......... *H03K 3/012* (2013.01); *H03K 19/0013* (2013.01); *H03K 19/018521* (2013.01)

(58) Field of Classification Search
CPC ....... H03K 19/00361; H03K 19/00315; H03K 17/063; H03K 19/0013; H03K 19/018521; H03K 19/018585; H04L 25/0278; H04L 25/0269
USPC .................................................. 327/108–112
See application file for complete search history.

(56) References Cited

U.S. PATENT DOCUMENTS

| | | | |
|---|---|---|---|
| 5,689,460 A * | 11/1997 | Ooishi | 365/189.07 |
| 7,327,168 B2 * | 2/2008 | Kimura | 326/88 |
| 8,295,020 B2 * | 10/2012 | Oki | 361/87 |
| 8,723,557 B2 * | 5/2014 | Ong et al. | 327/108 |
| 2010/0063628 A1 * | 3/2010 | Landry et al. | 700/258 |

* cited by examiner

*Primary Examiner* — Lincoln Donovan
*Assistant Examiner* — Diana J Cheng
(74) *Attorney, Agent, or Firm* — Dorsey & Whitney LLP

(57) ABSTRACT

Methods and apparatuses are disclosed for driving a node to one or more elevated voltages. One example apparatus includes a first driver circuit configured to drive a node to a first voltage, and a second driver circuit configured to drive the node to a pumped voltage after the node reaches a voltage threshold. The apparatus also includes a controller circuit configured to disable the first driver circuit and enable the second driver circuit responsive to the node reaching the voltage threshold.

27 Claims, 7 Drawing Sheets

US 9,755,617 B2

METHODS AND APPARATUSES FOR DRIVING A NODE TO A PUMPED VOLTAGE

TECHNICAL FIELD

Embodiments of the invention relate generally to integrated circuits, and more particularly, in one or more of the illustrated embodiments, to driving one or more nodes of an integrated circuit to one or more pumped voltages.

BACKGROUND OF THE INVENTION

Various nodes in integrated circuits frequently need to be to driven to a particular condition before some specified operation can be performed. For example, a word line or a bit line in a memory device may need to be driven to a specific voltage before a read or a write operation is performed. The node may sometimes be driven to the specified voltage using a standard power source (e.g., VCC for high level voltages or VSS for low level voltages including ground) of the integrated circuit. In other cases, however, the node may need to be driven to a pumped voltage that is greater or less than the available standard power source voltages. If, for example, VCC is 3 volts and VSS is ground (0 volts), the node may nonetheless need to be driven to 6 volts and/or −6 volts in order to perform some operation. In these embodiments, one or more charge pumps may be used to provide pumped voltages that can be used to drive the node to the pumped voltages.

A complementary metal-oxide semiconductor (CMOS) inverter is typically used together with one or more charge pumps in order to drive a node to one or more pumped voltages. For example, a single CMOS inverter may be coupled between low level and high level charge pumps, and have an output coupled to the node, and may use energy from the charge pumps to drive the node to the pumped low level voltage (e.g., −6 volts) and/or the pumped high level voltage (e.g., 6 volts). If the node has a relatively large capacitive load, however, driving the node using such a single CMOS inverter may take a relatively long time and/or consume a relatively large amount of power. In some applications, such as a mobile or any low-power apparatus, this relatively large power consumption may be unacceptable.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
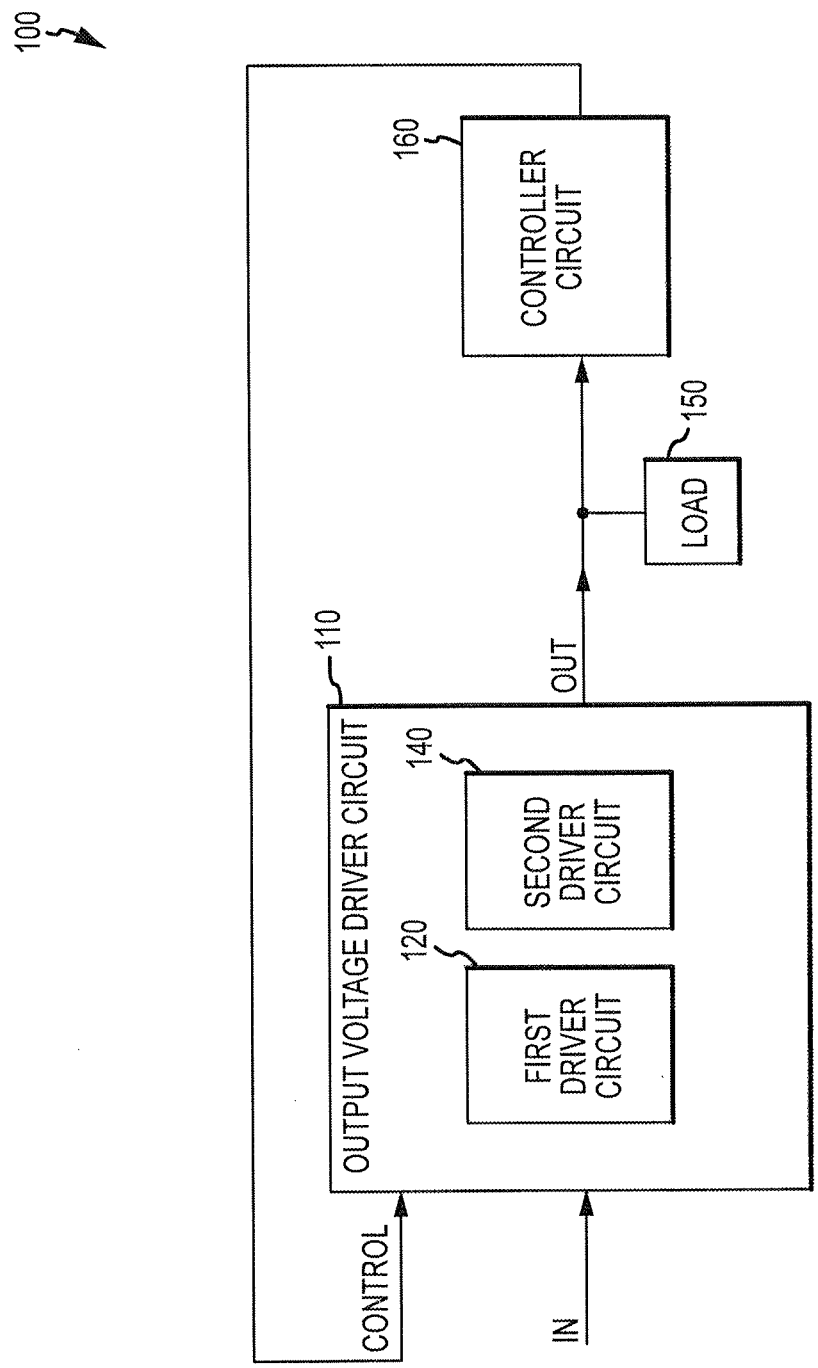
FIG. 1 is a block diagram of an apparatus for driving a node to one or more pumped voltages according to an embodiment of the present invention.

FIG. 1 illustrates an apparatus 100 for driving a node to a pumped voltage according to an embodiment of the invention. As used herein, apparatus may refer to, for example, an integrated circuit, a memory device, a memory system, an electronic device or system, a smart phone, a tablet, a computer, a server, etc. The apparatus 100 includes an output voltage driver circuit 110, which receives an input signal IN and provides an output signal OUT in response. The output voltage driver circuit 110 drives load 150 that is coupled to the OUT node responsive to changes in the IN signal—for example, if the IN signal provided to the output voltage driver circuit 110 has a low logic level, the output voltage driver circuit 110 may drive the OUT node and load 150 to a pumped high level voltage, whereas if the IN signal provided to the output voltage driver circuit 110 has a high logic level, the output voltage driver circuit 110 may drive the OUT node and load 150 to a pumped low level voltage. In other words, in some embodiments, the output voltage driver circuit 110 may invert the IN signal, although in other embodiments the output voltage driver circuit 110 may not invert the IN signal in driving the OUT node and load 150. A pumped voltage, as used herein, refers to a voltage that is greater in magnitude than a standard voltage available from a standard power source for the apparatus 100, such as from standard high level power source VCC or standard low level power source VSS (which may be ground in some embodiments). One or more charge pumps may be used to provide one or more pumped voltages, as described below.

The output voltage driver circuit 110 includes two or more driver circuits 120, 140. As illustrated in FIG. 1, the output voltage driver circuit 110 includes a first driver circuit 120 and a second driver circuit 140, but in other embodiments the output voltage driver circuit 110 may include more than two driver circuits. In driving the OUT node and load 150, the output voltage driver circuit 110 may separate the transitions of driving the OUT node to a pumped high level voltage into two or more stages, using one of the driver circuits 120, 140 for each stage. Likewise, the output voltage driver circuit 110 may separate the transitions of driving the OUT node to a pumped low level voltage into two or more stages, using one of the driver circuits 120, 140 for each stage. For example, the first driver circuit 120 may be used to drive the OUT node towards an intermediate high level voltage (e.g., a standard high level voltage), and the second driver circuit 140 may be used to drive the OUT node to a pumped high level voltage. Similarly, the first driver circuit 120 may be used to drive the OUT node towards an intermediate low level voltage (e.g., a standard low level voltage), and the second driver circuit 140 may be used to continue driving the OUT node to a pumped low level voltage. In some embodiments, the operation of the first and second driver circuits 120, 140 may overlap (e.g., they may both drive the OUT node for at least some overlapping period of time), whereas in other embodiments, the operation of the driver circuits 120, 140 does not overlap (e.g., only one of the driver circuits 120, 140 is ever operating at a single time).

As explained in more detail below, by splitting the driving of the OUT node to a pumped high level voltage or to a pumped low level voltage into two or more stages, for example, by using two or more driver circuits 120, 140, the output voltage driver circuit 110 may operate faster and/or may consume less power as compared with a single, standard CMOS inverter coupled to high level (e.g., positive) and low level (e.g., negative) charge pumps.

The first driver circuit 120 may be configured to drive the OUT node between standard high level and standard low level voltages. For example, the first driver circuit 120 may be coupled to a standard high level power source such as VCC (e.g., 3 volts) and also coupled to a standard low level power source such as VSS (e.g., 0 volts or ground). The first driver circuit 120 would thus be able to drive the OUT node up to VCC and drive the OUT node down to VSS. Similarly, the second driver circuit 140 may, in some examples, be configured to drive the OUT node between a pumped high level voltage VP (e.g., 6 volts) and a pumped low level voltage VN (e.g., −6 volts). The second driver circuit may be coupled to high level and low level charge pumps in order to be able to drive the OUT node to these pumped voltages. In some embodiments, however, one of the first and/or second driver circuits 120, 140 may only be configured to drive the OUT node to one voltage, or may be configured to drive the OUT node to more than two voltages. As just one example, and as explained further below with reference to FIG. 5, the first driver circuit 120 may be configured to drive the OUT node between standard high level and standard low level voltages, while the second driver circuit 140 may be configured to drive the OUT node to only one pumped voltage, such as a high level pumped voltage.

Referring still to FIG. 1, a controller circuit 150 may be coupled to the OUT node and may further provide a control signal CONTROL to the output voltage driver circuit 110. The CONTROL signal may include one or more control signals. The CONTROL signal may be generated based on a voltage of the OUT node, and may be used to selectively enable and disable the first and second driver circuits 120, 140.

In operation, responsive to the logic level of the IN signal (e.g., a high logic level) the first driver circuit 120 may drive the OUT node towards a first, intermediate voltage (e.g., VCC=3 volts), and the second driver circuit 140 may drive the OUT node to a pumped high level voltage (e.g., VP=6 volts) after the OUT node reaches a high level voltage threshold (e.g., VCC−VT1=2.3 volts), with the CONTROL signal from the controller circuit 160 disabling the first driver circuit 120 and enabling the second driver circuit 140 once the OUT node reaches the voltage threshold. As mentioned above, the output voltage driver 110 may drive the OUT node to a single pumped voltage, or may drive the OUT node to two or more pumped voltages. In those embodiments where the output voltage driver 110 is also configured to drive the OUT node from a pumped high level voltage to a pumped low level voltage, responsive to the logic level of the IN signal (e.g., a low logic level) the first driver circuit 120 may drive the OUT node towards a first, intermediate low level voltage (e.g., VSS=0 volts), and the second driver circuit 140 may then drive the OUT node to the pumped low level voltage (e.g., VN=−6 volts) after the OUT node reaches a low level voltage threshold (e.g., VSS+VT2=0.7 volts).

Figure 2:
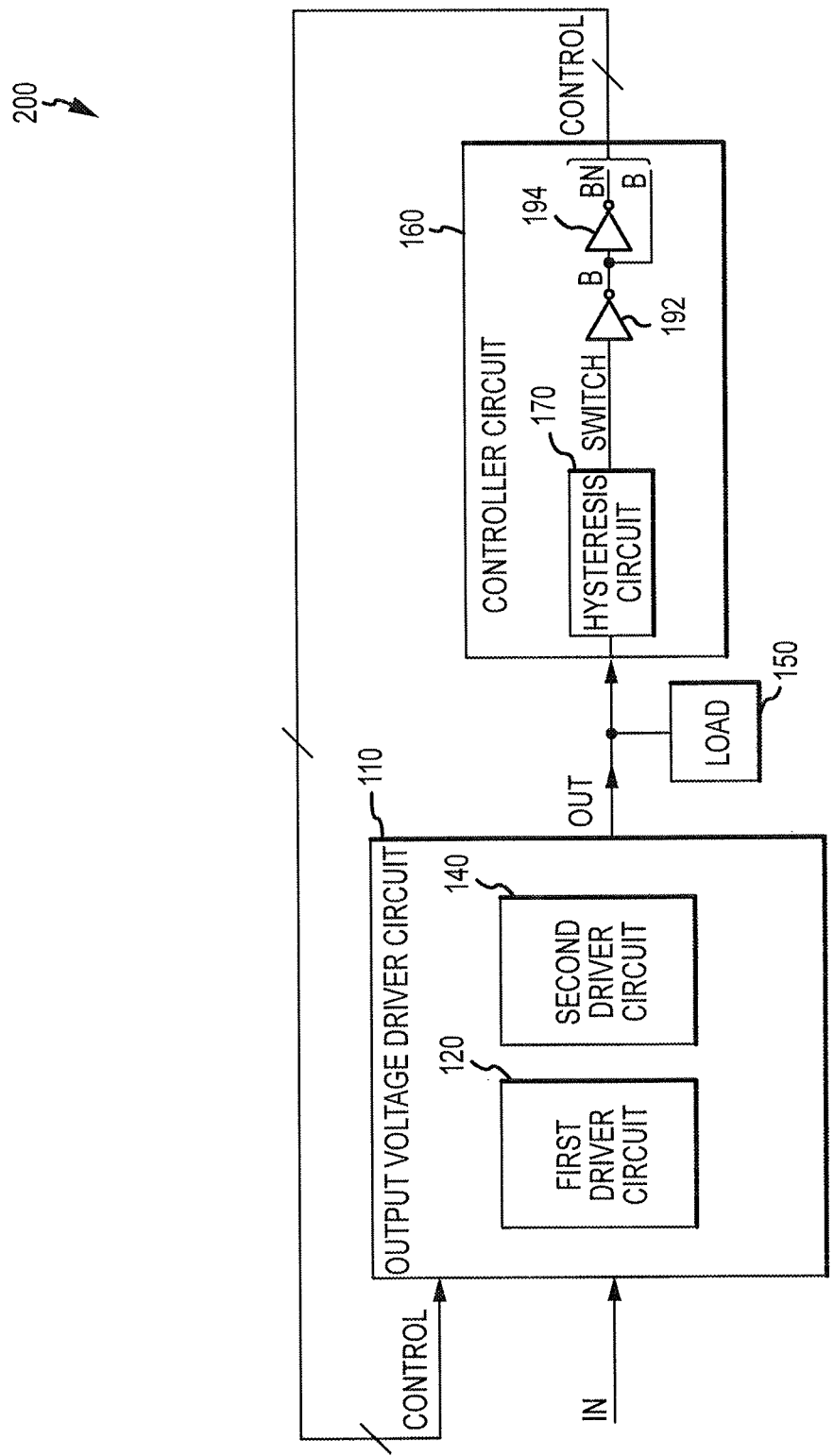
FIG. 2 is a block diagram of an apparatus for driving a node to one or more pumped voltages according to an embodiment of the present invention.

FIG. 2 illustrates an apparatus 200 for driving a node to a pumped voltage according to an embodiment of the invention. Like the apparatus 100 illustrated in FIG. 1, the apparatus 200 illustrated in FIG. 2 includes an output voltage driver circuit 110 with first and second driver circuits 120, 140, a load 150, and a controller circuit 160. The controller circuit 160 in FIG. 2 additionally includes a hysteresis circuit 170, and two inverters 192, 194. The hysteresis circuit 170 is coupled to and measures a voltage on the OUT node, and provides as its output a switching signal SWITCH, which is conditioned by inverter 192 and inverted by inverter 194 in order to generate complementary control signals B and BN. As illustrated in FIG. 2, the B and BN signals are provided to the output voltage driver circuit 110 in order to control the operation of the first and second driver circuits 120, 140—such as by selectively enabling and disabling the first and second driver circuits 120, 140 responsive to a voltage on the OUT node exceeding a reference voltage generated by the hysteresis circuit 170 (e.g., being greater than a reference high level voltage or less than a reference low level voltage).

The hysteresis circuit 170 maintains information regarding whether the OUT node is being driven to a high level voltage or to a low level voltage, and additionally provides the reference voltage against which the voltage on the OUT node can be compared in order to provide an active SWITCH signal. For example, when the OUT node is being driven to a high level voltage, the hysteresis circuit 170 may provide a reference high level voltage (e.g., VCC−VT1=3−0.7=2.3 volts), which may be a voltage at which the first driver circuit 110 should be disabled and the second driver circuit 120 should be enabled. After the OUT node is driven to that reference high level voltage, the hysteresis circuit may switch and provide a reference low level voltage (e.g., VSS+VT1=0+0.7=0.7 volts) while the OUT node is driven up to the pumped high level voltage VP and until the OUT node is driven down to that reference low level voltage. The reference low level voltage may correspond with the voltage on the OUT node at which the first driver circuit 120 should be disabled from driving the OUT node to the low level voltage and the second driver circuit 140 should be enabled to continue driving the OUT node down to the pumped low level voltage VN.

Figure 3:
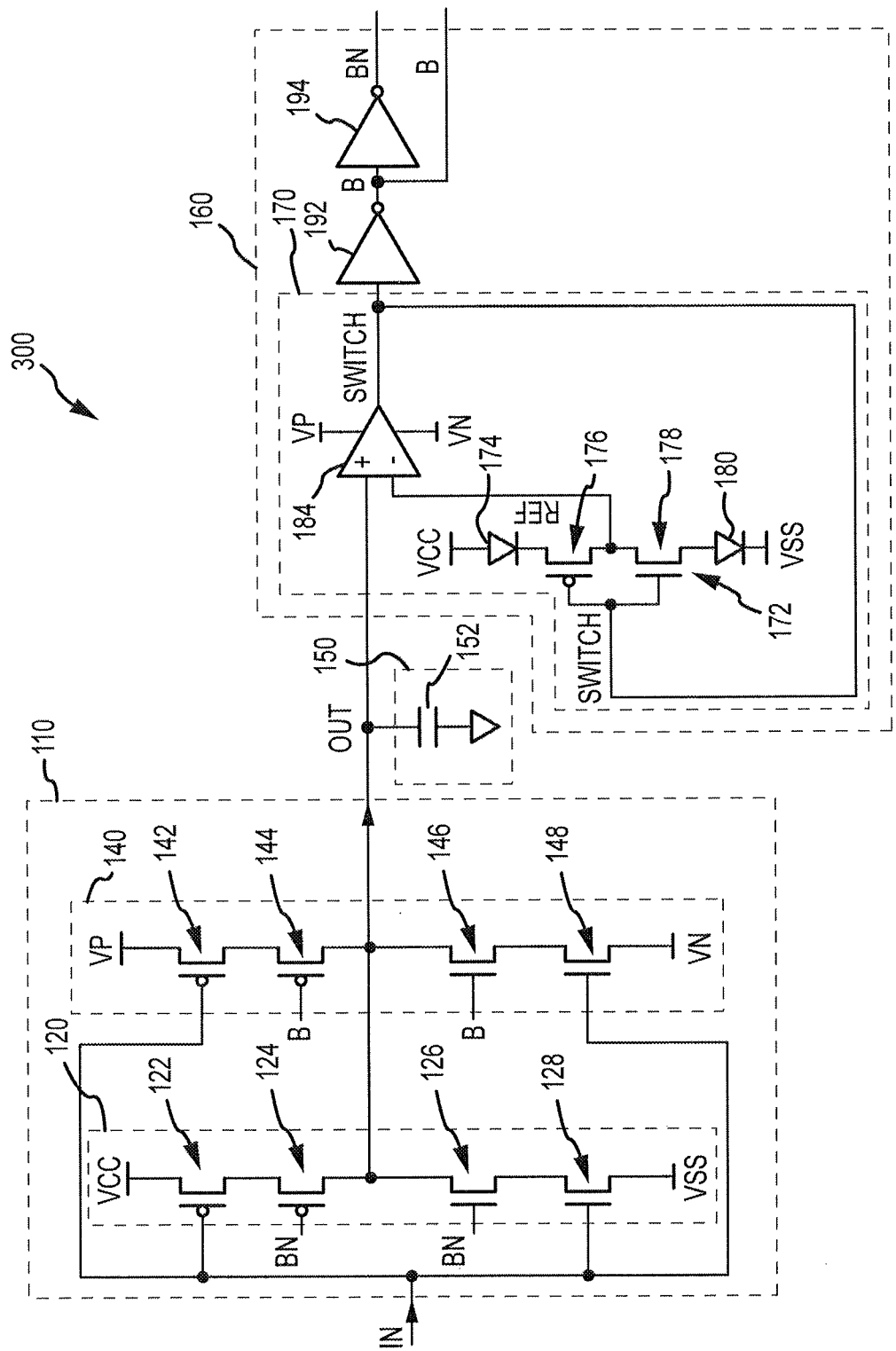
FIG. 3 is a simplified schematic diagram of an apparatus for driving a node to one or more pumped voltages according to an embodiment of the present invention.

FIG. 3 illustrates an apparatus 300 for driving a node to a pumped voltage according to an embodiment of the invention. Like the apparatuses 100 and 200 illustrated in FIGS. 1 and 2, the apparatus 300 illustrated in FIG. 3 includes an output voltage driver circuit 110 with first and second driver circuits 120, 140, a load 150, and a controller circuit 160.

As illustrated in FIG. 3, the first driver circuit 120 may, in one embodiment, include an enableable inverter with four field effect transistors (FETs) 122, 124, 126, 128. Two p-channel FETs (pFETs) 122, 124 may be coupled in series between a standard high level power source VCC and the OUT node, with two n-channel FETs (nFETs) 126, 128 coupled in series between the OUT node and a standard low level power source VSS. In one embodiment, the standard high level power source VCC may provide a potential of 3 volts and the standard low level power source VSS may provide a potential of 0 volts, or ground. The top pFET 122 and bottom nFET 128 act as a typical inverter, receiving the IN signal, and driving the OUT node inversely to the IN signal. The inner pFET 124 and inner nFET 126 receive the BN control signal from the controller circuit 160, and act to selectively couple the OUT node to one of the standard high level power source VCC or the standard low level power source VSS via the outer pFET 122 and nFET 128, respectively.

Similarly, the second driver circuit 140 may include, in one embodiment, an enableable inverter with four FETs 142, 144, 146, 148 arranged similarly to the FETs 122, 124, 126, 128 of the first driver circuit 120, except that the FETs 142, 144, 146, 148 of the second driver circuit 140 may be coupled between a high level charge pump VP and a low level charge pump VN, and the inner pFET 144 and inner nFET 146 may receive the B control signal from the controller circuit 160. As described above, during operation, the first and second driver circuits 120, 140 work together to effectuate a multi-stage transition of driving the OUT node.

The first and second driver circuits 120, 140 may be enabled based on the B and BN control signals provided by the controller circuit 160, which are a function of the voltage of the OUT node and whether the OUT node is being driven to a high level voltage or a low level voltage.

The load 150 is illustrated in FIG. 3 as a capacitance 152. The capacitance 152 may include, for example, a capacitance of a word or bit line in a memory array in some examples.

The controller circuit 160 in FIG. 3, like that in FIG. 2, may include a hysteresis circuit 170 and two inverters 192, 194 coupled in series. The hysteresis circuit 170 may include a modified inverter 172 that is configured to provide a reference voltage REF, and further includes a comparator 184 that is configured to compare a voltage on the OUT node with the reference voltage from the modified inverter 172 in order to determine when to selectively enable the first and second driver circuits 120, 140. Based on the comparison, the hysteresis circuit 170 may provide an output switching signal SWITCH that is provided to the inverters 192, 194, which, in turn, may selectively enable the first and second driver circuits 120, 140.

As illustrated in FIG. 3, the inverter 172 may include a diode 174 coupled between the standard high level power source VCC and the pFET 176 of the inverter 172, and another diode 180 coupled between the nFET 178 of the inverter 172 and the standard low level power source VSS. The diodes 174, 180 may be used to improve the speed at which the OUT node is driven to the high level or low level as they reduce the voltage threshold at which the second driver circuit 140 is enabled. Because the reference voltage REF is compared to the voltage on the OUT node in order to determine when the second driver circuit 140 is enabled, changing the reference voltages REF changes the OUT node voltage at which the second driver circuit 140 is enabled. Taking as an example the driving of the OUT node to the high level voltage, without the diode 174 the second driver circuit 140 would not be enabled until the OUT node reached VCC, whereas with the diode 174 the controller circuit 160 causes the second driver circuit 140 to be enabled when the OUT node reaches VCC−VT1, where VT1 is the voltage drop across the diode 174. This reduction in the threshold at which the second driver circuit 140 is enabled may improve the speed at which the OUT node is driven to the high level and/or the low level.

In some embodiments, not illustrated in FIG. 3, other circuit elements (such as resistors) may be used in place of diodes 174, 180 in order to achieve a similar effect. In still other embodiments, no diodes or other circuit elements may be used, and instead the inverter 172 may merely include pFET 176 and nFET 178 coupled between the standard high level power source VCC and the standard low level power source VSS.

The hysteresis circuit 170, and more specifically the inverter 172 may thus be configured to provide a reference high level voltage REF (e.g., VCC−VT1, where VT1 is the voltage drop across the diode 174) responsive to the OUT node being driven to the high level voltage, and may provide a reference low level voltage REF (e.g., VSS+VT2, where VT2 is the voltage drop across the diode 180) responsive to the OUT node being driven to the low level voltage. These different reference voltages provided by the inverter 172 in the feedback path of the comparator 184 provide the hysteresis of the hysteresis circuit 170—that is, they provide different voltage thresholds for enabling of the second driver circuit 140 to drive the OUT node.

The operation of the apparatus 300 illustrated in FIG. 3 is discussed below with reference to the timing diagram in FIG. 4, but it will be noted that by separating the driving of the OUT node to a high level voltage and/or a low level voltage into two or more segments using the first and second driver circuits 120, 140, power consumption may be reduced because the charge pumps are only used to drive the OUT node to the pumped voltages, while the standard power sources are used to intermediately drive the OUT node to the standard high level and low level voltages. In other words, and for the specific example given in FIG. 3, the standard high level power source VCC is used to intermediately drive the OUT node to VCC−VT1, and the high level charge pump VP is used to drive the OUT node the rest of the way up to the pumped high level voltage. Using the standard power sources to intermediately drive the OUT node to a standard voltage may reduce power consumption as compared with a single inverter coupled between charge pumps driving the OUT node to the pumped voltage, and thus may be advantageous for one or more reasons. For example, there may be less energy (thermally) dissipated through the transistors 122, 124 of the first driver circuit 120 while the OUT node is being driven to a high level voltage than would be dissipated through transistors 142, 144 if the second driver circuit 140 was used to drive the OUT node the entire way up to the pumped high level voltage. Secondly, because charge pumps are typically inefficient at generating the pumped voltages, using standard power sources such as VCC and VSS to drive the OUT node may consume less overall power than if the same result was achieved using power provided by the charge pumps.

Figure 3A:
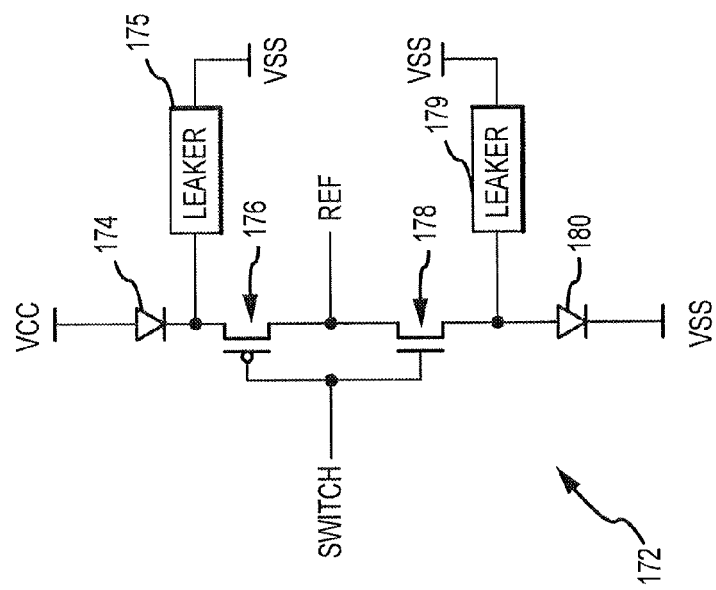
FIG. 3A is a simplified schematic diagram of a feedback inverter according to an embodiment of the present invention.

FIG. 3A illustrates a feedback inverter 172, according to an embodiment of the invention. The feedback inverter 172 illustrated in FIG. 3A is similar to the feedback inverter 172 illustrated in FIG. 3, except that leaker circuits 175 and 179 have been added. Leaker circuits 175 and 179 cause a small amount of leakage current to constantly flow through the diodes 174, 176, which ensures that the diodes 174, 176 are forward biased and thus provide the voltage drops VT1, VT2 across the diodes 174, 176. The leaker circuits 175, 179 may each include, in some examples, a relatively large resistance.

Figure 4:
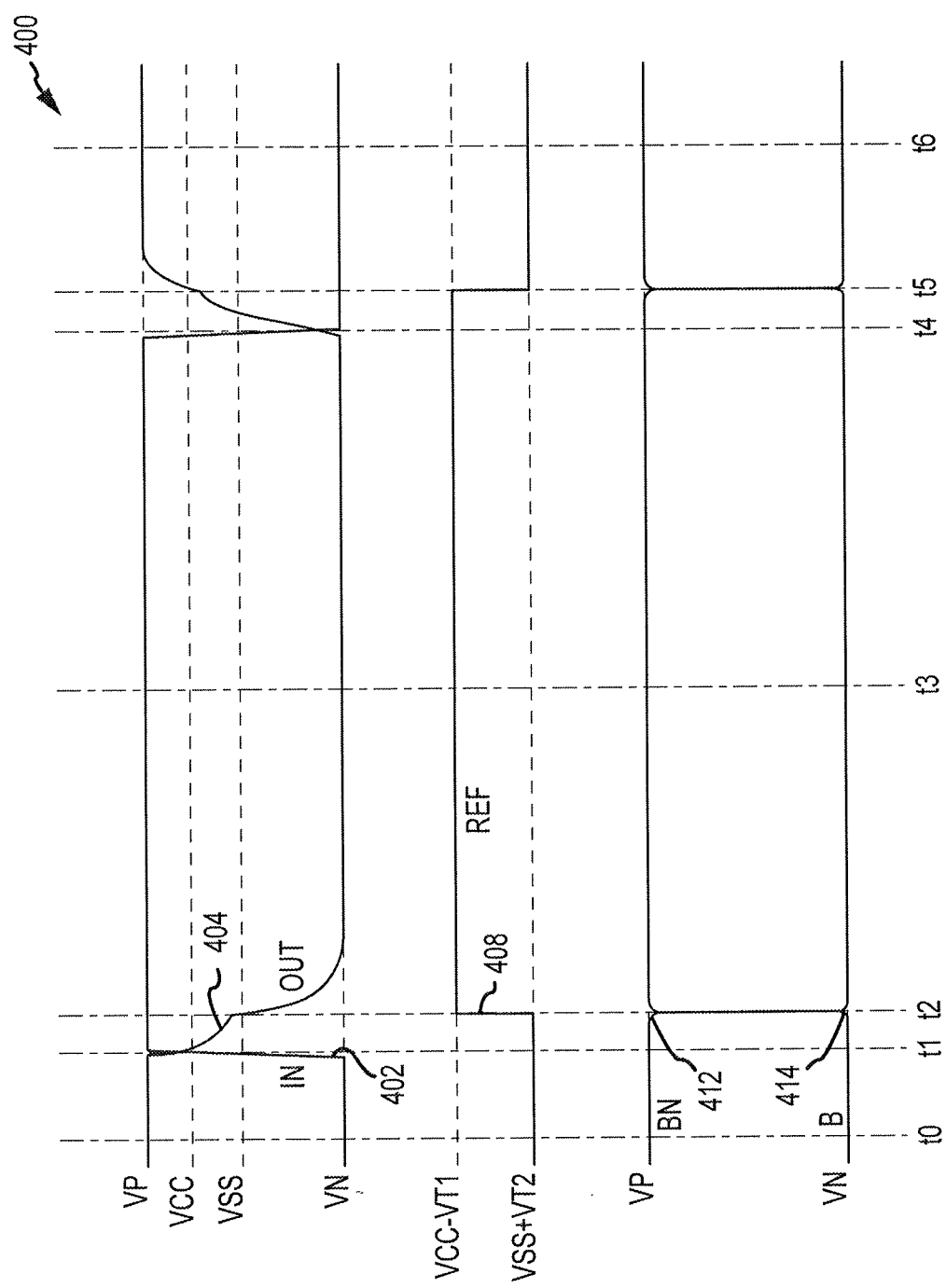
FIG. 4 is a simplified timing diagram for the apparatus of FIG. 3 according to an embodiment of the invention.

FIG. 4 is a simplified timing diagram 400 for the apparatus of FIG. 3 according to an embodiment of the invention. With reference to FIGS. 3 and 4, at time t0, the IN signal 402 is provided as logic low VN (which may be, for example, −6 volts), and the OUT node has been driven to the pumped high level voltage VP as shown by the OUT voltage signal 404. Also, at time t0, the inverter 172 is providing a reference low level voltage VSS+VT2 as seen on the REF signal 408, and the SWITCH signal indicates that the voltage on the OUT node is greater than the reference low level voltage VSS+VT2, which causes the B signal 414 to be provided by inverter 192 as a pumped low level voltage VN and the BN signal 412 to be provided by inverter 194 as a pumped high level voltage VP. At time t0, then, FETs 124, 128, 146, and 148 are turned off and the pumped high level voltage VP is coupled to the OUT node through FETs 142 and 144.

At time t1, the IN signal transitions to logic high VP (which may be, for examples, 6 volts), thereby signaling that the OUT node is to be driven to a pumped low level voltage VN. When the IN signal goes high, FETs 122 and 142 turn off, and FETs 128 and 148 turn on, thereby decoupling the OUT node from the pumped high level voltage VP and coupling the OUT node to the standard low level power source VSS through FETs 126 and 128. In this manner, between time t1 and t2, the first driver circuit 120 drives the voltage on the OUT node towards a low level intermediary voltage using the standard low level power source voltage VSS, until the voltage on the OUT node is less than or equal to the reference low level voltage VSS+VT2 being generated by the inverter 172. Thus the period between time t1 and t2 can be considered as the first stage of driving the OUT node to a pumped low level voltage.

At time t2, the voltage on the OUT node reaches the reference low level voltage VSS+VT2, which causes the REF, B, and BN signals to transition because the comparator 184 indicates that the voltage provided to its positive terminal is no longer greater than the voltage provided to its negative terminal. At time t2, the first driver circuit 120 is disabled (specifically, FET 126 is turned off) due to the changed BN control signal, and the second driver circuit 140 is enabled (specifically, FET 146 is turned on, thereby coupling the OUT node to the low level charge pump VN through FETs 146 and 148). Also at time t2, the inverter 172 in the hysteresis circuit 170 switches and provides a reference high level voltage VCC−VT1. After time t2, including at time t3, the OUT node is driven to the pumped low level voltage by the second driver circuit 140 in combination with the low level charge pump VN. Thus the period between time t2 and the time when the OUT node reaches the pumped low level voltage can be considered as the second stage of driving the OUT node to a pumped low level voltage.

At time t4, the IN signal changes again, thereby signaling that the OUT node is to be driven to a pumped high level voltage VP. When the IN signal goes low, FETs 128 and 148 turn off, and FETs 122 and 142 turn on, thereby decoupling the OUT node from the low level charge pump VN and coupling the OUT node to the standard high level power source VCC through FETs 122, 124. In this manner, between time t4 and t5, the first driver circuit 120 drives the voltage on the OUT node towards a high level intermediary voltage using the standard high level power source voltage VCC, until the voltage on the OUT node is greater than or equal to the reference high level voltage VCC−VT1 being generated by the inverter 172. Thus the period between time t4 and t5 can be considered as the first stage of driving the OUT node to a pumped high level voltage.

At time t5, the voltage on the OUT node reaches the reference high level voltage VCC−VT1, which causes the REF, B, and BN signals to transition because the comparator 184 indicates that the voltage provided to its positive terminal is no longer less than the voltage provided to its negative terminal. At time t5, the first driver circuit 120 is disabled (specifically, FET 124 is turned off) due to the changed BN control signal, and the second driver circuit 140 is enabled (specifically, FET 144 is turned on, thereby coupling the OUT node to the pumped high level voltage VP through FETS 142 and 144). Also at time t5, the inverter 172 in the hysteresis circuit 170 switches and again provides a reference low level voltage VSS+VT2. After time t5, including at time t6, the OUT node is driven to the pumped high level voltage by the second driver circuit 140 in combination with the high level charge pump VP, and the cycle may begin again at time t0. Thus the period between time t5 and the time when the OUT node reaches the pumped high level voltage can be considered as the second stage of driving the OUT node to a pumped high level voltage.

As can be seen in the timing diagram 400 of FIG. 4 (specifically looking at the B and BN control signals provided to the first and second driver circuits 120, 140), the second driver circuit 140 may not be used in some examples to drive the OUT node until the low level or high level voltage thresholds VSS+VT2, VCC−VT1 are reached. In other words, the second driver circuit 140 may be disabled while the OUT node is driven to the low level or high level voltage thresholds VSS+VT2, VCC−VT1. Similarly, the first driver circuit 120 may not be used after the low level or high level voltage thresholds VSS+VT2, VCC−VT1 are reached, or in other words, the first driver circuit 120 may be disabled once the low level or high level voltage thresholds VSS+VT2, VCC−VT1 are reached, before the OUT node reaches the voltage of the standard low level or high level power source voltages VSS, VCC.

Figure 5:
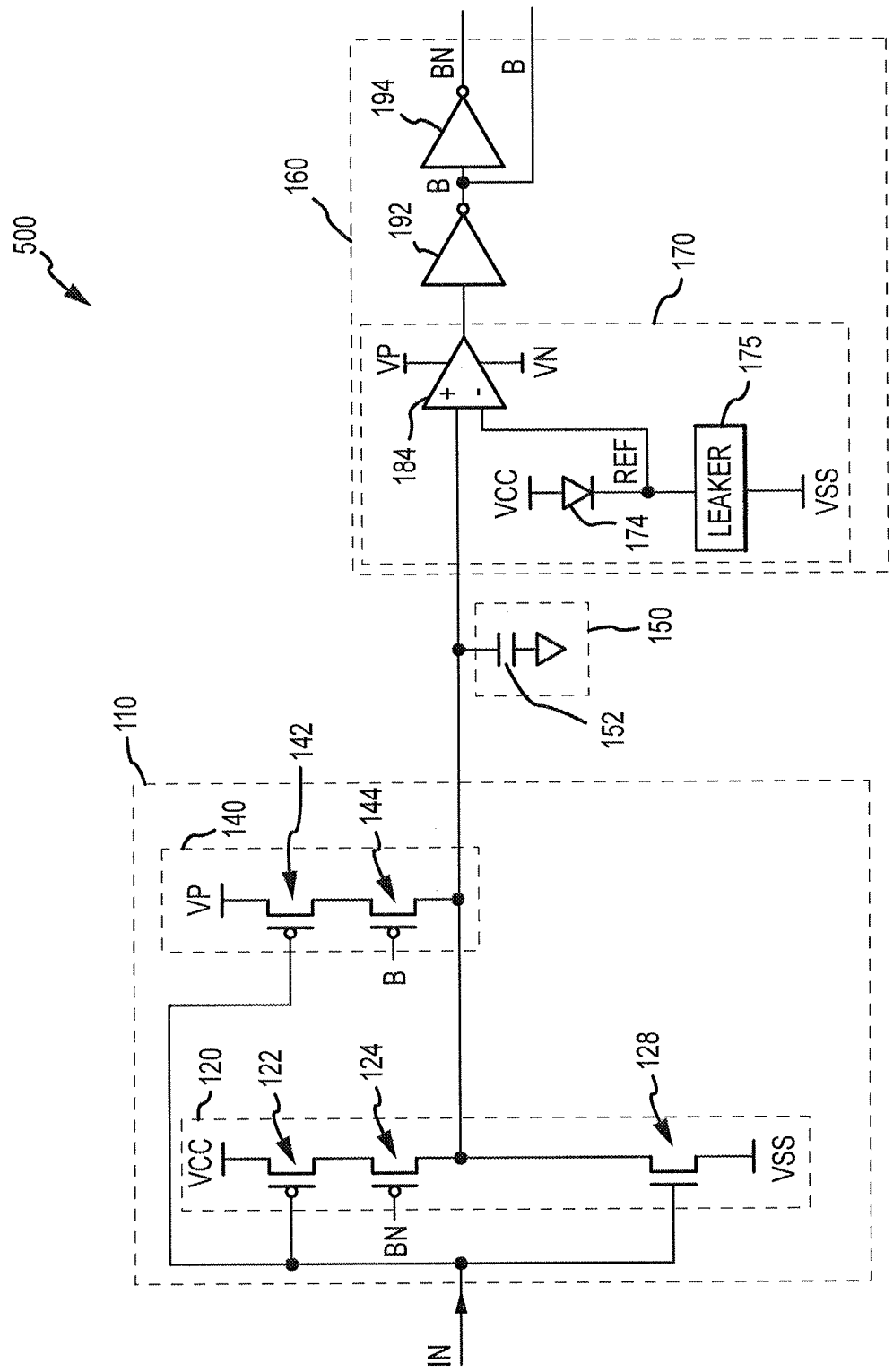
FIG. 5 is a simplified schematic diagram of an apparatus for driving a node to one or more pumped voltages according to an embodiment of the present invention.

FIG. 5 illustrates an apparatus 500 for driving a node to a pumped voltage according to an embodiment of the invention. As mentioned above, in some embodiments, the output voltage driver circuit 110 may only need to drive the OUT node to one pumped voltage, such as a pumped high level voltage VP. In this case, the first and second driver circuits 120, 140, as well as the hysteresis circuit 170 may be simplified as illustrated in FIG. 5. Specifically, the first driver circuit 120 in FIG. 5 may have one less FET than the first driver circuit 120 in FIG. 3 (i.e., FET 126), the second driver circuit 140 in FIG. 5 may have two less FETs than the second driver circuit 120 in FIG. 3 (i.e., FETs 146, 148, and the hysteresis circuit 170 in FIG. 5 may include only a single diode 174 and optionally a leaker circuit 175 coupled between the standard high level and low level power sources VCC, VSS. In this example, the first driver circuit 120 operates to drive the OUT node between the standard high level and low level power source voltages VCC, VSS, and also to drive the OUT node to a pumped high level voltage VP, but not to a pumped low level voltage.

In an analogous embodiment to that illustrated in FIG. 5, however, the second driver circuit 140 may only drive the OUT node to a pumped low level voltage VN, and not to a pumped high level voltage.

Figure 6:
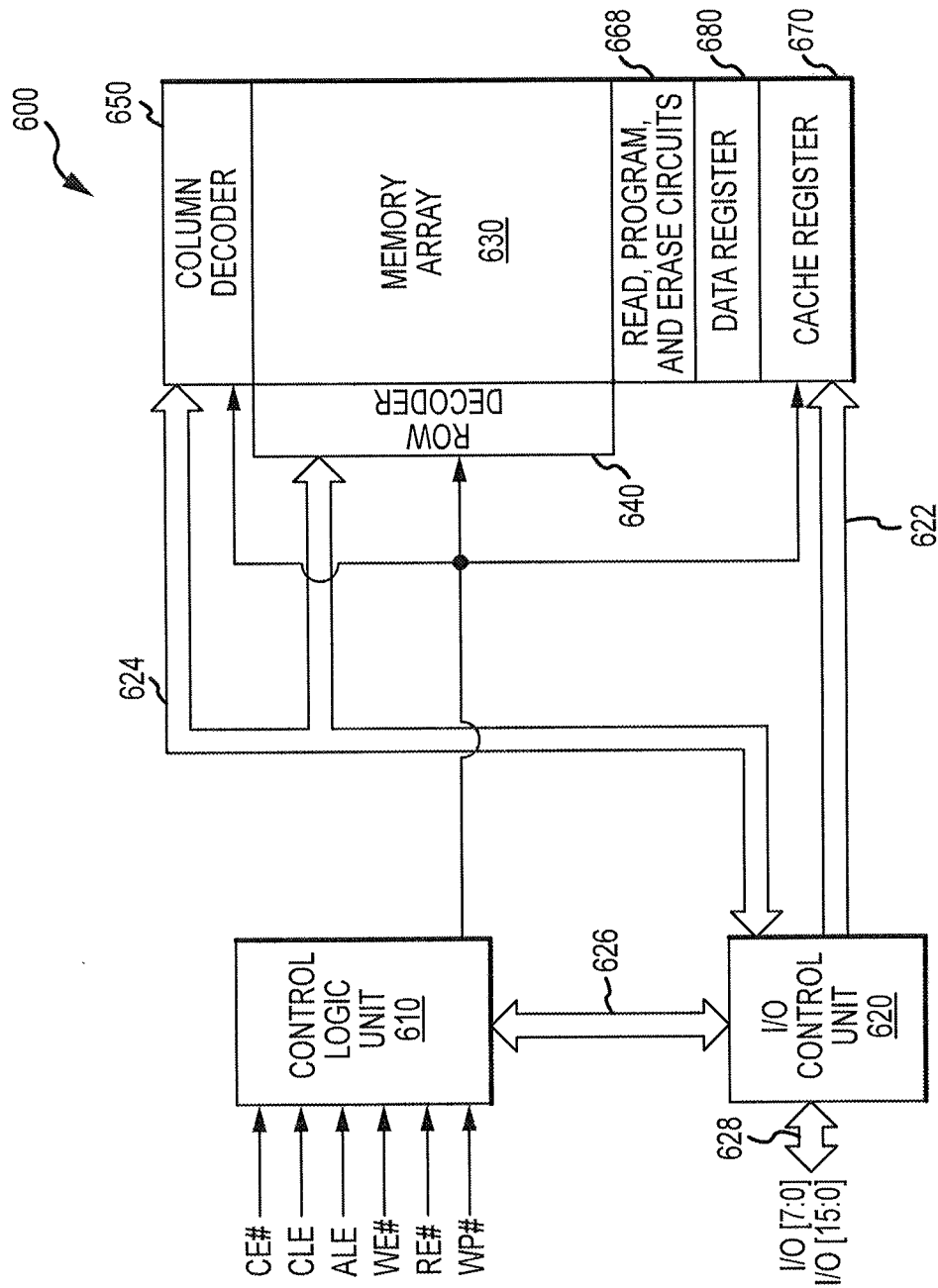
FIG. 6 is a block diagram of a memory according to an embodiment of the invention.

FIG. 6 illustrates a memory 600 according to an embodiment of the present invention. The memory 600 includes a memory array 630 with a plurality of memory cells. The memory cells may be non-volatile memory cells, such as NAND or NOR flash cells, phase change memory cells, or may generally be any type of memory cells.

Command signals, address signals and write data signals may be provided to the memory 600 as sets of sequential input/output ("I/O") signals transmitted through an I/O bus 628. Similarly, read data signals may be provided from the memory 600 through the I/O bus 628. The I/O bus 628 is connected to an I/O control unit 620 that routes the signals between the I/O bus 628 and an internal data bus 622, an internal address bus 624, and an internal command bus 626. The memory 600 also includes a control logic unit 610 that receives a number of control signals either externally or through the command bus 626 to control the operation of the memory 600.

The address bus 624 applies block-row address signals to a row decoder 640 and column address signals to a column decoder 650. The row decoder 640 and column decoder 650 may be used to select blocks of memory or memory cells for memory operations, for example, read, program, and erase operations. The row decoder 640 and/or the column decoder 650 may include one or more signal line drivers configured to provide a biasing signal to one or more of the signal lines in the memory array 630. The column decoder 650 may enable write data signals to be applied to columns of memory corresponding to the column address signals and allow read data signals to be coupled from columns corresponding to the column address signals.

In response to the memory commands decoded by the control logic unit 610, the memory cells in the array 630 are read, programmed, or erased. Read, program, and erase circuits 668 coupled to the memory array 630 receive control signals from the control logic unit 610 and include voltage generators for generating various pumped voltages for read, program and erase operations. In some embodiments, the signal line drivers of the row and/or column decoders 640, 650, and/or the voltage generators of the read, program, and erase circuits 668 may include one or more of the output voltage driver circuits 110 described above and illustrated in FIGS. 1-3 and 5.

After the row address signals have been applied to the address bus 624, the I/O control unit 620 routes write data signals to a cache register 670. The write data signals are stored in the cache register 670 in successive sets each having a size corresponding to the width of the I/O bus 628. The cache register 670 sequentially stores the sets of write data signals for an entire row or page of memory cells in the array 630. All of the stored write data signals are then used to program a row or page of memory cells in the array 630 selected by the block-row address coupled through the address bus 624. In a similar manner, during a read operation, data signals from a row or block of memory cells selected by the block-row address coupled through the address bus 624 are stored in a data register 680. Sets of data signals corresponding in size to the width of the I/O bus 628 are then sequentially transferred through the I/O control unit 620 from the data register 680 to the I/O bus 628.

From the foregoing it will be appreciated that, although specific embodiments of the invention have been described herein for purposes of illustration, various modifications may be made without deviating from the spirit and scope of the invention. For example, FIGS. 1, 2, 3, and 5 illustrate embodiments of output voltage driver circuits 110, first driver circuits 120, second driver circuits 140 and controller circuits 160, FIGS. 2, 3, and 5 illustrate embodiments of hysteresis circuits 170, and so forth. However, other output voltage driver circuits, first driver circuits, second driver circuits, controller circuits, hysteresis circuits, and so forth may be used, which are not limited to having the same design, and may be of different designs and include circuitry different from the circuitry in the embodiments illustrated in these figures.

For example, as mentioned above, in some embodiments, the driving of the OUT node to the pumped high level voltage and/or pumped low level voltage may be separated into three or more stages, rather than merely two stages as described above. Also, in some embodiments, only a single reference and/or transition voltage may be used—for example 0 volts. Furthermore, it will be understood that references to "high" and "low," "positive" and "negative," and so forth, as well as all of the voltage described herein are relative.

Accordingly, the invention is not limited to the specific embodiments of the invention described herein.

What is claimed is:

1. An apparatus, comprising:
a first driver circuit configured to drive a node to a first voltage;
a second driver circuit configured to drive the node to a pumped voltage after the node reaches a voltage threshold; and
a controller circuit configured to disable the first driver circuit and enable the second driver circuit responsive to the node reaching the voltage threshold, the controller circuit including a diode used to provide the voltage threshold that is less than the first voltage.

2. The apparatus of claim 1, wherein the first driver circuit comprises a first enableable inverter coupled between a standard high level power source and a standard low level power source, and the second driver circuit comprises a second enableable inverter coupled between a high level charge pump and a low level charge pump.

3. The apparatus of claim 2, wherein the controller circuit is configured to provide a control signal to selectively enable and disable the first and second enableable inverters.

4. The apparatus of claim 1, wherein the first voltage is a first high level voltage, the pumped voltage is a pumped high level voltage, and the voltage threshold is a high level voltage threshold, further wherein the first driver circuit is configured to drive the node to a first low level voltage, the second driver circuit is configured to drive the node to a pumped low level voltage after the node reaches a low level voltage threshold, and the controller circuit is configured to disable the first driver circuit and enable the second driver circuit responsive to the node reaching the low level voltage threshold.

5. The apparatus of claim 4, wherein the first driver circuit is configured to drive the node to the first high level voltage via a standard high level power source, the second driver circuit is configured to drive the node to the pumped high level voltage via a high level charge pump, the first driver circuit is further configured to drive the node to the first low level voltage via a standard low level power source, and the second driver circuit is further configured to drive the node to the pumped low level voltage via a low level charge pump.

6. The apparatus of claim 4, wherein the controller circuit comprises a hysteresis circuit including the diode, the hysteresis circuit configured to maintain information regarding whether the node is being driven to the pumped high level voltage or driven to the pumped low level voltage and is further configured to provide a reference voltage.

7. An apparatus, comprising:
a first driver circuit configured to drive a node between standard high level and low level voltages;
a second driver circuit configured to drive the node to a pumped voltage; and
a controller circuit configured to compare a voltage of the node to a reference voltage to selectively enable the first and second driver circuits based on the comparison, wherein the reference voltage is a first voltage responsive to the node being driven to a high level voltage and the reference voltage is a second voltage responsive to the node being driven to a low level voltage.

8. The apparatus of claim 7, wherein the standard low level voltage is zero volts or ground voltage.

9. The apparatus of claim 7, wherein the controller circuit is configured to disable the first driver circuit and enable the second driver circuit responsive to the voltage of the node exceeding the reference voltage, wherein the reference voltage is in between the standard high level and low level voltages.

10. The apparatus of claim 7, wherein the second driver circuit is configured to drive the node to a pumped high level voltage and/or a pumped low level voltage.

11. The apparatus of claim 7, wherein the controller circuit comprises:
   an inverter configured to provide a reference voltage; and
   a comparator configured to compare the voltage of the node and the reference voltage to determine when to selectively enable the first and second driver circuits.

12. The apparatus of claim 11, wherein an output of the comparator is configured to be used to selectively enable the first and second driver circuits.

13. The apparatus of claim 11, wherein the inverter comprises a first diode coupled between a standard high level power source and a pFET, and a second diode coupled between a standard low level power source and an nFET.

14. The apparatus of claim 13, further comprising a leaker circuit coupled to the first diode and configured to forward bias the first diode.

15. The apparatus of claim 11, wherein the inverter is configured to provide the first reference voltage and to provide the second reference voltage.

16. An apparatus, comprising:
   an output voltage driver circuit configured to drive a node responsive to an input signal, the output voltage driver circuit comprising:
      an intermediate-voltage driver configured to drive the node to an intermediate voltage via a standard power source; and
      a pumped-voltage driver configured to drive the node to a pumped voltage via a charge pump; and
   a controller circuit configured to provide a control signal to the output voltage driver circuit responsive to the node attaining a voltage threshold, the controller circuit including a diode used to provide the voltage threshold that is less than the intermediate voltage.

17. The apparatus of claim 16, wherein the controller circuit is configured to provide a first control signal to the intermediate-voltage driver and a second control signal to the pumped-voltage driver, and the first and second control signals are complementary to each other.

18. The apparatus of claim 16, wherein the controller circuit comprises:
   an inverter including the diode and configured to generate a reference voltage against which a voltage of the node can be compared; and
   a comparator configured to compare the reference voltage and the voltage of the node.

19. The apparatus of claim 18, wherein the inverter is configured to generate different reference voltages depending on whether the node is being driven to high level voltage or to a low level voltage.

20. A method, comprising:
   providing an output node a first voltage or a second voltage using a first driver circuit coupled to a first power source; and
   responsive to the node reaching a voltage threshold less than the first voltage, driving the output node to a pumped voltage using a second driver circuit coupled to a second power source, wherein the voltage threshold is a first voltage threshold responsive to providing the node the first voltage and the reference voltage is a second voltage threshold different than the first voltage threshold responsive to providing the node the second voltage.

21. The method of claim 20, wherein the second driver circuit is not used to drive the output node until the voltage threshold is reached.

22. The method of claim 21, further comprising disabling the second driver circuit as the output node is driven to the voltage threshold.

23. The method of claim 21, wherein the first driver circuit is not used to drive the output node once the output node reaches the voltage threshold.

24. The method of claim 23, further comprising disabling the first driver circuit once the output node reaches the voltage threshold.

25. The method of claim 23, further comprising disabling the first driver circuit before the output node reaches the first voltage.

26. A method, comprising:
   providing a voltage to a node to drive the node to a high level voltage threshold using a first driver circuit based on a changing input signal, wherein the high level voltage threshold is less than the provided voltage;
   responsive to the node having a voltage greater than or equal to the high level voltage threshold, disabling the first driver circuit to cease driving the node and enabling a second driver circuit to continue driving the node to a pumped high level voltage;
   driving the node to a low level voltage threshold using the first driver based on the changing input signal;
   responsive to the node having a voltage less than or equal to a reference low level voltage, enabling the second driver circuit to continue driving the node to a pumped low level voltage; and
   generating the reference voltage in a hysteresis circuit using a diode based on whether the node is being driven to the pumped high level voltage or driven to the pumped low level voltage.

27. The method of claim 26, wherein the node is driven to the high level voltage threshold and the pumped high level voltage responsive to the changing input signal being provided as logic low, and the node is driven to the low level voltage threshold and the pumped low level voltage responsive to the changing input signal being provided as logic high.

* * * * *